US010396120B2

(12) United States Patent
Kadono et al.

(10) Patent No.: US 10,396,120 B2
(45) Date of Patent: Aug. 27, 2019

(54) METHOD FOR PRODUCING SEMICONDUCTOR EPITAXIAL WAFER AND METHOD OF PRODUCING SOLID-STATE IMAGING DEVICE

(71) Applicant: SUMCO CORPORATION, Tokyo (JP)

(72) Inventors: Takeshi Kadono, Tokyo (JP); Kazunari Kurita, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 16/061,692

(22) PCT Filed: Dec. 5, 2016

(86) PCT No.: PCT/JP2016/086830
§ 371 (c)(1),
(2) Date: Jun. 13, 2018

(87) PCT Pub. No.: WO2017/104584
PCT Pub. Date: Jun. 22, 2017

(65) Prior Publication Data
US 2018/0374891 A1 Dec. 27, 2018

(30) Foreign Application Priority Data
Dec. 15, 2015 (JP) ................................. 2015-244458

(51) Int. Cl.
*H01L 21/00* (2006.01)
*H01L 27/146* (2006.01)
(Continued)

(52) U.S. Cl.
CPC ...... *H01L 27/14687* (2013.01); *C30B 25/186* (2013.01); *C30B 25/20* (2013.01);
(Continued)

(58) Field of Classification Search
CPC ............. H01L 27/14687; H01L 21/324; H01L 21/3221
See application file for complete search history.

(56) References Cited

U.S. PATENT DOCUMENTS 5,622,567 A * 4/1997 Kojima ................ C23C 14/022
118/726
6,051,483 A 4/2000 Lee et al.
(Continued)

FOREIGN PATENT DOCUMENTS

JP 10-189473 7/1998
JP 2013-197373 9/2013
(Continued)

OTHER PUBLICATIONS

International Search Report issued in International Bureau of WIPO Patent Application No. PCT/JP2016/086830, dated Jan. 10 2017.
(Continued)

*Primary Examiner* — Laura M Menz
(74) *Attorney, Agent, or Firm* — Greenblum & Bernstein, P.L.C.

(57) ABSTRACT

A semiconductor epitaxial wafer production method that can increase the peak concentration of hydrogen in a surface portion of a semiconductor wafer after epitaxial layer formation is provided. A method of producing a semiconductor epitaxial wafer comprises: a first step of irradiating a surface of a semiconductor wafer with cluster ions containing hydrogen as a constituent element, to form a modifying layer formed from, as a solid solution, a constituent element of the cluster ions including hydrogen in a surface portion of the semiconductor wafer; a second step of, after the first step, irradiating the semiconductor wafer with electromagnetic waves of a frequency of 300 MHz or more and 3 THz or less, to heat the semiconductor wafer; and a third step of, after the
(Continued)

second step, forming an epitaxial layer on the modifying layer of the semiconductor wafer.

6 Claims, 4 Drawing Sheets

(51) Int. Cl.
- H01L 21/02 (2006.01)
- C30B 25/18 (2006.01)
- C30B 25/20 (2006.01)
- C30B 29/06 (2006.01)
- H01J 37/317 (2006.01)
- H01L 21/265 (2006.01)
- H01L 31/18 (2006.01)
- H01L 21/322 (2006.01)
- H01L 21/324 (2006.01)

(52) U.S. Cl.
CPC .......... *C30B 29/06* (2013.01); *H01J 37/3171* (2013.01); *H01L 21/02381* (2013.01); *H01L 21/02532* (2013.01); *H01L 21/02658* (2013.01); *H01L 21/26506* (2013.01); *H01L 21/26566* (2013.01); *H01L 21/324* (2013.01); *H01L 21/3221* (2013.01); *H01L 31/1804* (2013.01)

(56) References Cited

U.S. PATENT DOCUMENTS

| | | | |
|---|---|---|---|
| 2007/0231010 A1* | 10/2007 | Ohta | G03G 15/0291 399/168 |
| 2009/0142879 A1* | 6/2009 | Isaka | H01L 31/03762 438/96 |
| 2009/0142908 A1* | 6/2009 | Isaka | H01L 31/077 438/481 |
| 2009/0209059 A1* | 8/2009 | Isaka | H01L 31/02242 438/74 |
| 2010/0047952 A1* | 2/2010 | Ohnuma | H01L 31/0236 438/58 |
| 2011/0084216 A1 | 4/2011 | Hautala et al. | |
| 2011/0124164 A1* | 5/2011 | Noda | H01L 21/268 438/166 |
| 2013/0069195 A1* | 3/2013 | Suguro | H01L 21/76254 257/506 |
| 2016/0181311 A1* | 6/2016 | Kadono | C23C 14/48 438/57 |
| 2016/0181313 A1 | 6/2016 | Kadono et al. | |
| 2017/0352545 A1* | 12/2017 | Hirose | H01L 21/02005 |
| 2018/0374891 A1* | 12/2018 | Kadono | C30B 25/186 |

FOREIGN PATENT DOCUMENTS

| | | | | |
|---|---|---|---|---|
| JP | 2014-99454 | | 5/2014 | |
| JP | 2014-99465 | | 5/2014 | |
| JP | 2015-23150 | | 2/2015 | |
| JP | 2017112181 A | * | 6/2017 | .......... C30B 25/186 |
| JP | 6459948 B2 | * | 1/2019 | .......... C30B 25/186 |
| WO | 2012/157162 | | 11/2012 | |
| WO | WO-2017104584 A1 | * | 6/2017 | .......... C30B 25/186 |

OTHER PUBLICATIONS

International Preliminary Report on Patentability issued in International Bureau of WIPO Patent Application No. PCT/JP2016/086830 and English language translation thereof, dated Jun. 19, 2018.
Office Action issued in Japan Counterpart Patent Appl. No. 2015-244458, dated Sep. 11, 2018, along with an English translation thereof.

* cited by examiner

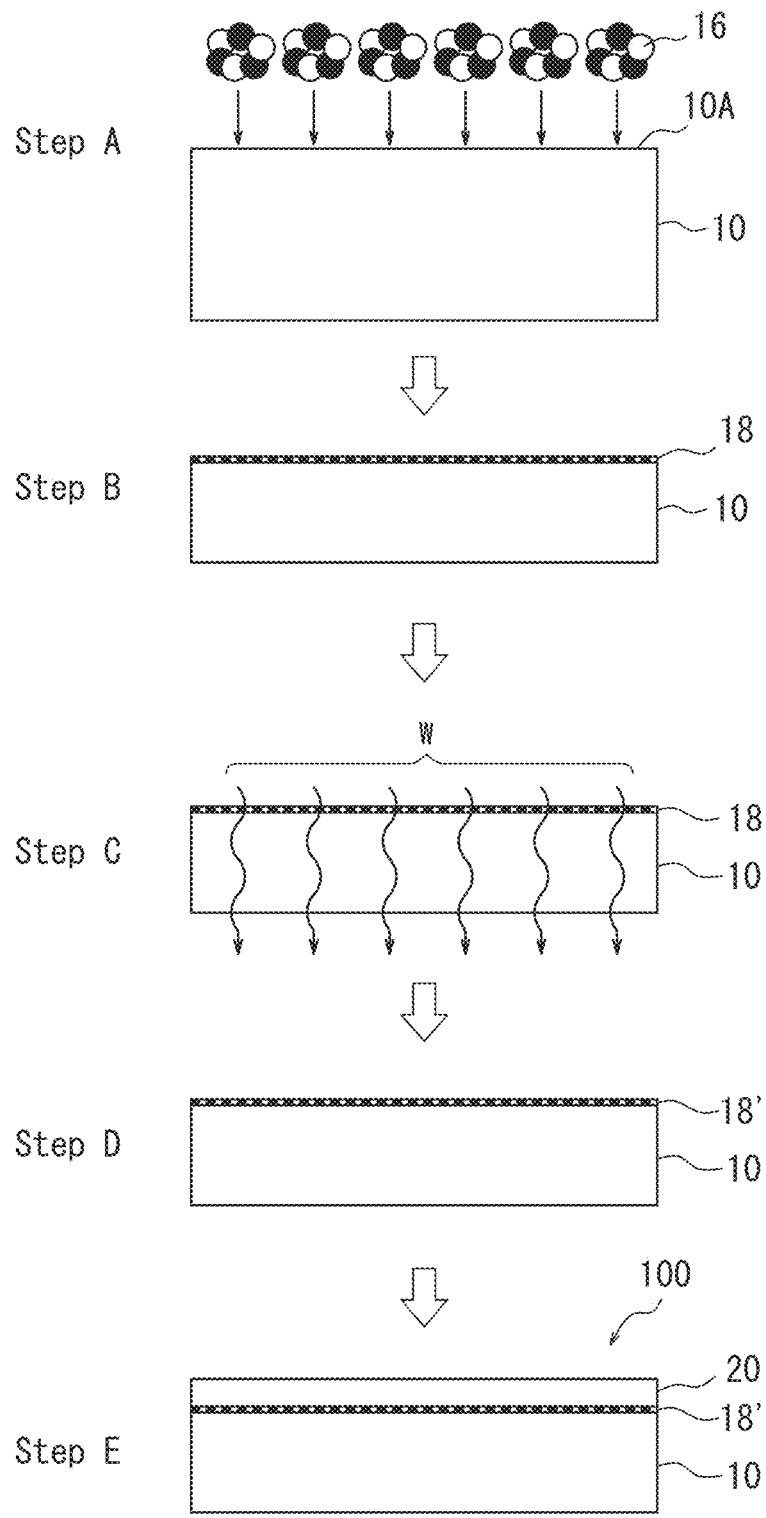

METHOD FOR PRODUCING SEMICONDUCTOR EPITAXIAL WAFER AND METHOD OF PRODUCING SOLID-STATE IMAGING DEVICE

TECHNICAL FIELD

The present disclosure relates to a method of producing a semiconductor epitaxial wafer and a method of producing a solid-state imaging device.

BACKGROUND

A semiconductor epitaxial wafer obtained by forming an epitaxial layer on a semiconductor wafer is used as a device substrate for producing various semiconductor devices, such as a metal-oxide-semiconductor field-effect transistor (MOSFET), dynamic random access memory (DRAM), a power transistor, and a back-illuminated solid-state imaging device.

For example, a back-illuminated solid-state imaging device can directly take outside light into a sensor to capture a sharper image or video even in a dark place and the like, by arranging a wiring layer and the like below a sensor part. Hence, back-illuminated solid-state imaging devices are widely used in digital video cameras and mobile phones such as smartphones in recent years.

With increasing refinement and performance improvement of semiconductor devices in recent years, semiconductor epitaxial wafers used as device substrates are desired to have higher quality, in order to improve device properties. For further improvement in device properties, crystal quality improving techniques by oxygen precipitation heat treatment, gettering techniques for preventing heavy-metal contamination during epitaxial growth, etc. have been developed.

For example, JP 2013-197373 A (PTL 1) describes a technique of controlling oxygen precipitation heat treatment conditions, when performing oxygen precipitation heat treatment on a silicon substrate and then forming an epitaxial layer to produce an epitaxial wafer. With the technique described in PTL 1, the value of leakage current of the epitaxial wafer after the formation of the epitaxial layer can be limited to 1.5E-10A or less.

Moreover, we have proposed the following technique with regard to gettering, in WO 2012/15716 A1 (PTL 2): A method of producing a semiconductor epitaxial wafer comprises: a first step of irradiating a surface of a semiconductor wafer with cluster ions, to form a modifying layer formed from a constituent element of the cluster ions contained as a solid solution in a surface portion of the semiconductor wafer; and a second step of forming an epitaxial layer on the modifying layer of the semiconductor wafer.

CITATION LIST

Patent Literatures

PTL 1: JP 2013-197373 A
PTL 2: WO 2012/157162 A1

SUMMARY

Technical Problem

As described in PTL 1 and PTL 2, various attempts to improve the quality of semiconductor epitaxial wafers have been made. Meanwhile, the crystallinity inside the epitaxial layer of the semiconductor epitaxial wafer has been regarded as sufficiently high, and so far no technique of enhancing the crystallinity inside the epitaxial layer has been proposed. Through the following studies and experimental results, we have conceived that improvement in device properties (for example, reduction of white spot defects in the case of solid-state imaging devices) is likely to be achieved if the crystallinity inside the epitaxial layer can be further increased.

It is known that, even if hydrogen which is a light element is ion-implanted into a semiconductor wafer, hydrogen diffuses due to heat treatment during epitaxial layer formation. When actually observing the hydrogen concentration profile of a semiconductor epitaxial wafer obtained by implanting hydrogen ions into a semiconductor wafer under typical conditions and then forming an epitaxial layer on the surface of the semiconductor wafer on the side where a hydrogen ion implantation region has been formed, the observed hydrogen concentration is less than a detection limit by secondary ion mass spectrometry (SIMS).

On the other hand, our research newly revealed that, in the case where a surface of a semiconductor wafer is irradiated with hydrogen in the form of cluster ions to form a modifying layer formed from the constituent element of the cluster ions contained as a solid solution in a surface portion of the semiconductor wafer, the use of appropriate irradiation conditions enables hydrogen to be localized in the modifying layer even after epitaxial layer formation.

We observed the difference in crystallinity between an epitaxial layer of a semiconductor epitaxial wafer having hydrogen localized in a modifying layer and an epitaxial layer of a semiconductor epitaxial wafer whose hydrogen concentration peak is not detectable by typical SIMS (e.g. hydrogen concentration detection limit: $7.0 \times 10^{16}$ atoms/cm), by the cathode luminescence (CL) method. The CL method is a method of measuring crystal defects by irradiating a sample with an electron beam to detect excitation light when transitioning from near the bottom of the conduction band to near the top of the valence band.

In the former semiconductor epitaxial wafer, a peak of transverse optical (TO) line intensity in the epitaxial layer was observed. In the latter semiconductor epitaxial wafer, the tendency that TO line intensity gradually decreases from the interface between the semiconductor wafer and the epitaxial layer toward the surface of the epitaxial layer in the thickness direction was observed. A TO line is a spectrum specific to Si element corresponding to the bandgap of Si observed by the CL method. Higher TO line intensity indicates higher crystallinity of Si.

We thus learned that the former semiconductor epitaxial wafer has better crystallinity in the epitaxial layer than the latter semiconductor epitaxial wafer. Next, assuming device formation using a semiconductor epitaxial wafer, we observed TO line intensity in the case of applying heat treatment simulating device formation to the semiconductor epitaxial wafer. We consequently found out that, even after the heat treatment simulating device formation, the epitaxial layer of the former semiconductor epitaxial wafer, while maintaining the peak of TO line intensity, has approximately the same level of TO line intensity as the epitaxial layer of the latter semiconductor epitaxial wafer in regions other than the peak. It was thus revealed that, after epitaxial layer formation, the semiconductor epitaxial wafer having hydrogen localized in the modifying layer has high overall crystallinity of the epitaxial layer, as compared with the semiconductor epitaxial wafer whose hydrogen concentration peak is not detectable. Based on the tendency of changes in hydrogen concentration and TO line intensity between before and after the heat treatment simulating device formation, it can be considered that, as a result of performing the heat treatment simulating the device formation step, hydrogen present at high concentration in the surface portion of the semiconductor wafer passivates point defects in the epitaxial layer, thus enhancing the crystallinity of the epitaxial layer.

This led us to consider that hydrogen localized in the semiconductor epitaxial wafer passivates defects in the epitaxial layer when subjecting the semiconductor epitaxial wafer to the device production step, as a result of which device quality can be improved. If the peak concentration of hydrogen in the surface portion of the semiconductor wafer is able to be increased, the passivation effect is likely to be higher.

It could therefore be helpful to provide a semiconductor epitaxial wafer production method that can increase the peak concentration of hydrogen in a surface portion of a semiconductor wafer after epitaxial layer formation.

Solution to Problem

We conducted detailed research to solve the problem stated above. Since hydrogen is a light element, when epitaxial layer formation is performed on the modifying layer, hydrogen diffuses considerably because the formation involves high-temperature heat treatment, as mentioned earlier. Accordingly, we conducted further research, and conceived an idea that, after performing cluster ion irradiation and before forming the epitaxial layer, the semiconductor wafer is irradiated with electromagnetic waves of a predetermined frequency to heat the semiconductor wafer, to control the diffusion of hydrogen localized in the modifying layer. We discovered that, by this electromagnetic wave irradiation, the diffusion of hydrogen in the surface portion of the semiconductor wafer can be suppressed even after the epitaxial layer formation, and as a result the peak concentration of hydrogen can be significantly increased as compared with the case where electromagnetic wave irradiation is not performed. We thus provide the following.

A method of producing a semiconductor epitaxial wafer according to the present disclosure comprises: a first step of irradiating a surface of a semiconductor wafer with cluster ions containing hydrogen as a constituent element, to form a modifying layer formed from, as a solid solution, a constituent element of the cluster ions including hydrogen in a surface portion of the semiconductor wafer; a second step of, after the first step, irradiating the semiconductor wafer with electromagnetic waves of a frequency of 300 MHz or more and 3 THz or less, to heat the semiconductor wafer; and a third step of, after the second step, forming an epitaxial layer on the modifying layer of the semiconductor wafer.

Preferably, the cluster ions further contain carbon as a constituent element.

Preferably, in the first step, a beam current value of the cluster ions is 50 µA or more. Preferably, in the first step, a beam current value of the cluster ions is 5000 µA or less.

Preferably, the semiconductor wafer is a silicon wafer.

A method of producing a solid-state imaging device according to the present disclosure comprises forming a solid-state imaging device on an epitaxial layer of a semiconductor epitaxial wafer produced by any one of the above-mentioned methods of producing a semiconductor epitaxial wafer.

Advantageous Effect

According to the present disclosure, a semiconductor wafer is irradiated with electromagnetic waves of a predetermined frequency, to heat the semiconductor wafer. A semiconductor epitaxial wafer production method that can increase the peak concentration of hydrogen in a surface portion of a semiconductor wafer after epitaxial layer formation can thus be provided.

BRIEF DESCRIPTION OF TI-IE DRAWINGS

In the accompanying drawings:

FIG. 1 is a schematic sectional diagram illustrating a method of producing a semiconductor epitaxial wafer 100 according to one of the disclosed embodiments;

DETAILED DESCRIPTION

Figure 2A:
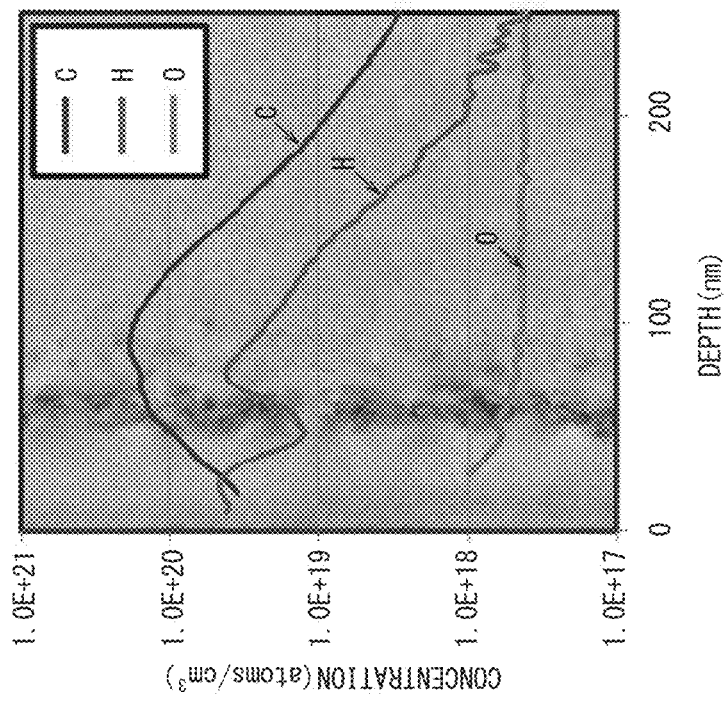
FIG. 2A is a diagram in which a TEM sectional photograph of a silicon wafer after irradiation with cluster ions and a graph illustrating the concentration profile of each of carbon, hydrogen, and oxygen in the portion corresponding to the TEM sectional photograph are overlaid with each other in Reference Experimental Example 1.

One of the disclosed embodiments is described in detail below, with reference to drawings, In FIG. 1, the thicknesses of a semiconductor wafer 10, a modifying layer 18 (18'), and an epitaxial layer 20 are exaggerated and differ from an actual thickness ratio, for simplicity's sake.

(Method of Producing Semiconductor Epitaxial Wafer)

As illustrated in FIG. 1, a method of producing a semiconductor epitaxial wafer 100 according to one of the disclosed embodiments includes: a first step of irradiating a surface 10A of the semiconductor wafer 10 with cluster ions 16 containing hydrogen as a constituent element, to form the modifying layer 18 formed from, as a solid solution, a constituent element of the cluster ions 16 including hydrogen in a surface portion of the semiconductor wafer 10 (Step A and Step B in FIG. 1); a second step of, after the first step, irradiating the semiconductor wafer 10 with electromagnetic waves W of a frequency of 300 MHz or more and 3 THz or less, to heat the semiconductor wafer 10 (Step C and Step D in FIG. 1); and a third step of, after the second step, forming the epitaxial layer 20 on the modifying layer 18' of the semiconductor wafer 10 (Step E in FIG. 1). Step E in FIG. 1 is a schematic sectional diagram of the semiconductor epitaxial wafer 100 obtained as a result of this production method. The epitaxial layer 20 is a device layer for producing a semiconductor device such as a back-illuminated solid-state imaging device. We consider that the modifying layer 18 is altered in some way as a result of the second step (described in detail later). To distinguish between before and after the alteration, the modifying layer that has undergone the second step is referred to as "modifying layer 18'".

The semiconductor wafer 10 is, for example, a bulk single-crystal wafer that is made of silicon or a compound semiconductor (GaAs, GaN, SiC) and has no epitaxial layer on its surface. In the case of producing a back-illuminated solid-state imaging device, typically a bulk single-crystal silicon wafer is used. As the semiconductor wafer 10, a single-crystal silicon ingot grown by the Czochralski method (CZ method) or the floating zone melting method (FZ method) may be sliced with a wire saw or the like and put to use. To achieve higher gettering capability, carbon and/or nitrogen may be added to the semiconductor wafer 10. Moreover, any dopant may be added to the semiconductor wafer 10 at a predetermined concentration, to obtain an n+ type or p+ type, or n− type or p− type substrate.

As the semiconductor wafer 10, an epitaxial semiconductor wafer obtained by forming a semiconductor epitaxial layer on a surface of a bulk semiconductor wafer may be used. An example is an epitaxial silicon wafer obtained by forming a silicon epitaxial layer on a surface of a bulk single-crystal silicon wafer. This silicon epitaxial layer may be formed under typical conditions by the CVD method. The thickness of the epitaxial layer is preferably in a range of 0.1 µm to 20 µm, and more preferably in a range of 0.2 µm to 10 µm.

One of the characteristic steps in this disclosure is the first step in Step A of FIG. 1, In this description, "cluster ions" denotes a product yielded by applying a positive charge or a negative charge to a cluster, which is an aggregate of a plurality of atoms or molecules, to ionize the cluster. A cluster is an aggregate of a plurality of (typically about 2 to 2000) atoms or molecules combined with each other.

In the case of irradiating a silicon wafer, which is one type of semiconductor wafer, with cluster ions composed of carbon and hydrogen as an example, the cluster ions 16, upon being applied to the silicon wafer, instantaneously reach a high-temperature state of about 1350° C. to 1400° C. due to the energy, and the silicon melts. After this, the silicon is rapidly cooled, and carbon and hydrogen form solid solutions in the silicon wafer near the surface. Thus, the "modifying layer" in this description denotes a layer in which the constituent elements of the applied ions form solid solutions at crystal interstitial sites or substitution sites in the surface portion of the semiconductor wafer. The concentration profile of carbon in the depth direction of the silicon wafer according to secondary ion mass spectrometry (SIMS) is, although dependent on the acceleration voltage and cluster size of the cluster ions, sharper than in the case of monomer ions. The thickness of the region (i.e. modifying layer) in which the applied carbon is localized is approximately 500 nm or less (e.g. about 50 nm to 400 nm). In the case where the constituent elements of the cluster ions 16 include an element contributing to gettering, the modifying layer 18 also functions as a gettering site. Thus, by irradiation with the cluster ions 16, the modifying layer 18 formed from, as a solid solution, the constituent element (or elements) of the cluster ions 16 including hydrogen is formed in the surface portion of the semiconductor wafer 10.

After the first step, that is, after the formation of the modifying layer 18, the second step of irradiating the semiconductor wafer 10 with electromagnetic waves of a frequency of 300 MHz or more and 3 THz or less to heat the semiconductor wafer 10 is performed (Step C and Step D in FIG. 1).

Electromagnetic waves of a frequency of 300 MHz or more and 3 THz or less are referred to as "microwaves" in a broad sense. Heating the semiconductor wafer 10 by irradiation with electromagnetic waves of a frequency of 300 MHz or more and 3 THz or less is referred to as "microwave heating" or "microwave annealing". In this description, heating the semiconductor wafer 10 by irradiation with electromagnetic waves of a frequency of 300 MHz or more and 3 THz or less is hereafter referred to as "microwave heating". This step can be performed using a commercially available microwave heater, and the constituent elements of the cluster ions 16 localized in the modifying layer 18 are vibrationally excited by electromagnetic wave irradiation to perform local heating, thus controlling diffusion of hydrogen. The modifying layer 18 is damaged by cluster ion irradiation. Depending on the irradiation conditions, there is a possibility that an amorphous region forms in the modifying layer. Microwave heating can repair the damage caused by the cluster ion irradiation and recover crystallinity, and so can recover from deterioration in the surface roughness of the surface 10A of the semiconductor wafer 10. The electromagnetic wave irradiation conditions for performing microwave heating are not limited, as long as the diffusion of hydrogen localized in the modifying layer 18 can be controlled. For example, electromagnetic wave irradiation may be performed in a range in which the temperature of the semiconductor wafer is 50° C. or more and 1000° C. or less. The frequency of the electromagnetic waves applied may be from the millimeter-wave to the infrared region. For example, the frequency of the electromagnetic waves applied may be 300 MHz or more and 300 GHz or less. The irradiation time of the electromagnetic waves may be, for example, 10 sec or more and 30 min or less. The output of the electromagnetic waves applied may be, for example, 5 W or more and 12 kW or less. This step is one of the characteristic steps in this disclosure, as with the first step. Through this step, the modifying layer 18 becomes the modifying layer 18'. The technical significance of performing these two steps will be described in detail later.

After the second step, the third step of forming the epitaxial layer 20 on the modifying layer 18' of the semiconductor wafer 10 is performed (Step E in FIG. 1). The epitaxial layer 20 is, for example, a silicon epitaxial layer, and may be formed under typical conditions. In this case, for example, using hydrogen as carrier gas, source gas such as dichlorosilane or trichlorosilane may be introduced into the chamber, and epitaxially grown on the semiconductor wafer 10 by the CVD method at a temperature in a range of approximately 1000° C. to 1200° C., although the growth temperature differs depending on the source gas used. The thickness of the epitaxial layer 20 is preferably in a range of 1 µm to 15 µm. If the thickness of the epitaxial layer 20 is less than 1 µm, there is a possibility that outward dopant diffusion from the semiconductor wafer 10 causes a change in the resistivity of the epitaxial layer 20. If the thickness of the epitaxial layer 20 is more than 15 µm, there is a possibility that the spectral sensitivity characteristics of the solid-state imaging device are affected.

The technical significance of performing the first and second steps in this disclosure is described in more detail below.

Hydrogen ions, because of being a light element, easily diffuse outward due to heat treatment during the formation of the epitaxial layer 20 or the like, and tend not to stay in the semiconductor wafer after the epitaxial layer formation. In view of this, the cluster ions 16 containing hydrogen as a constituent element are applied to form the modifying layer 18 in which hydrogen is localized. We recognized experimentally that, by adjusting the cluster ion irradiation conditions, hydrogen can be made to remain in the surface portion (i.e. in the modifying layer) of the semiconductor wafer even after the epitaxial layer formation. However, we simultaneously recognized that, when the epitaxial layer 20 is formed after the cluster ion irradiation, the hydrogen peak concentration of the concentration profile in the depth direction (hereafter simply referred to as "peak concentration of hydrogen") decreases to about 0.5% of the peak concentration of hydrogen immediately after the cluster ion irradiation. Here, "hydrogen remaining" means that the peak concentration of hydrogen after the formation of the epitaxial layer 20 is such a level that is detectable by SIMS. In this description, the "hydrogen concentration profile in the depth direction" denotes the hydrogen concentration distribution in the depth direction measured by SIMS. For example, the peak concentration of hydrogen is detectable by magnetic sector-type SIMS, if it is $7.0 \times 10^{16}$ atoms/cm$^3$ or more.

Figure 2B:
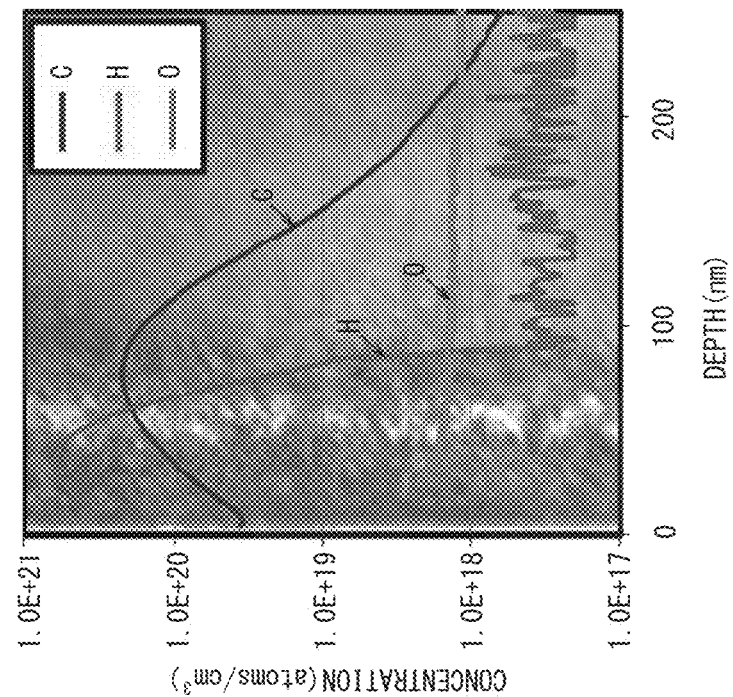
FIG. 2B is a diagram in which a TEM sectional photograph of a silicon wafer after microwave heating and a graph illustrating the concentration profile of each of carbon, hydrogen, and oxygen in the portion corresponding to the TEM sectional photograph are overlaid with each other in Reference Experimental Example 1.

We found out experimentally that, by performing the second step in this disclosure, the peak concentration of hydrogen even after the formation of the epitaxial layer 20 can be increased as compared with the case where the second step is not performed. More detailed research on the cause of this increase led us to consider that the increase results from some kind of alteration, such as phase transformation, in the modifying layer 18. After performing cluster ion irradiation on the silicon wafer under the same conditions (the details of the experimental conditions will be described in detail later in the Reference Experimental Examples), we obtained a diagram in which a TEM sectional photograph of the silicon wafer and a graph illustrating the concentration profile of each of carbon, hydrogen, and oxygen in the portion corresponding to the TEM sectional photograph are overlaid with each other (FIG. 2A). We also obtained a diagram in which a TEM sectional photograph of the silicon wafer after microwave heating and a graph illustrating the concentration profile of each of carbon, hydrogen, and oxygen in the portion corresponding to the TEM sectional photograph are overlaid with each other (FIG. 2B). The concentration profiles in FIGS. 2A and 2B were acquired by quadrupole-type SIMS. As can be seen from FIG. 2A, an amorphous region was formed near the cluster ion implantation range (a range of about 40 nm to 80 nm in depth). As can be seen from FIG. 2B, as a result of microwave heating, the crystallinity of the amorphous region was partially recovered. In FIG. 2A involving no microwave heating, the hydrogen concentration rapidly decreases in a region deeper than the modifying layer 18. In FIG. 2B involving microwave heating, on the other hand, the hydrogen concentration decrease rate is more gentle, demonstrating that hydrogen is trapped in the modifying layer 18'. From these results and the difference in the peak concentration of hydrogen after the epitaxial layer formation (and also with reference to FIGS. 3A, 3B, and 4 described later in the Examples), we consider that the altered modifying layer 18' has a higher hydrogen trapping function than the modifying layer 18, with it being possible to increase the peak concentration of hydrogen after the epitaxial layer formation.

As described above, according to this embodiment, the semiconductor epitaxial wafer 100 with an increased peak concentration of hydrogen in the surface portion of the semiconductor wafer after the epitaxial layer formation can be produced. A semiconductor device produced using such a semiconductor epitaxial wafer 100 including the epitaxial layer 20 has improved device properties.

After the hydrogen diffusion control in the second step, the semiconductor wafer 10 may be subjected to recovery heat treatment for crystallinity recovery, before the third step. This recovery heat treatment may be performed, for example, by holding the semiconductor wafer 10 in an epitaxial apparatus at a temperature of 900° C. or more and 1100° C. or less for 10 min or more and 60 min or less in an atmosphere of nitrogen gas, argon gas, or the like. The recovery heat treatment may be performed using, for example, a rapid temperature-raising/lowering heat treatment apparatus separate from epitaxial apparatus, such as rapid thermal annealing (RTA) or rapid thermal oxidation (RTO).

The cluster ion irradiation mode in this disclosure is described below.

There are various types of clusters depending on the manner of combination. For example, cluster ions can be generated by known methods described in the following documents: Gas cluster beam generation methods are described in (1) JP H9-41138 A and (2) JP H4-354865 A. Ion beam generation methods are described in (1) Junzo Ishikawa, "Charged particle beam engineering", Corona Publishing, ISBN 978-4-339-00734-3, (2) The Institution of Electrical Engineers of Japan, "Electron/Ion Beam Engineering", Ohmsha, ISBN 4-88686-217-9, and (3) "Cluster Ion Beam—Basic and Applications", The Nikkan Kogyo Shimbun, ISBN 4-526-05765-7. Typically, a Nielsen ion source or a Kaufman ion source is used for generating positively charged cluster ions, and a high current negative ion source using volume production is used for generating negatively charged cluster ions.

Regarding the constituent elements of the cluster ions 16 applied, as long as hydrogen is included, the other constituent elements are not limited. Examples of the constituent elements of the cluster ions 16 other than hydrogen include carbon, boron, phosphorus, and arsenic. In terms of achieving high gettering capability, the cluster ions 16 preferably contain carbon as a constituent element. The modifying layer 18 (the modifying layer 18' after the second step) with carbon contained as a solid solution serves as a strong gettering site. This is because carbon atoms at a lattice site have a smaller covalent radius than silicon single crystals, so that a compression site is formed in the silicon crystal lattice, which attracts interstitial impurities. Moreover, in the case where the cluster ions 16 contain carbon as a constituent element, carbon forming a solid solution in the modifying layer 18 traps hydrogen. This trapping function is likely to be stronger in the modifying layer 18'. Therefore, the inclusion of carbon is also preferable in terms of increasing the peak concentration of hydrogen.

It is also preferable that the constituent elements of the cluster ions include one or more elements other than hydrogen and carbon. In particular, it is preferable to apply one or more dopant elements selected from the group consisting of boron, phosphorus, arsenic, and antimony in the form of cluster ions, in addition to hydrogen and carbon. Since the types of metals that can be efficiently gettered differ depending on the types of elements forming solid solutions, a wider variety of metal contaminations can be addressed by making a plurality of elements into solid solutions. For example, carbon enables efficient gettering of nickel, and boron enables efficient gettering of copper (Cu) and iron (Fe).

The compounds to be ionized are not limited. As ionizable carbon source compounds, ethane, methane, and the like may be used. As ionizable boron source compounds, diborane, decaborane ($B_{10}H_{14}$), and the like may be used. For example, in the case where mixed gas of dibenzyl and decaborane is used as material gas, a hydrogen compound cluster in which carbon, boron, and hydrogen aggregate can be produced. In the case where cyclohexane ($C_6H_{12}$) is used as material gas, cluster ions composed of carbon and hydrogen can be produced. As a carbon source compound, in particular, cluster $C_nH_m$ ($3 \leq n \leq 16$, $3 \leq m \leq 10$) generated from pyrene ($C_{16}H_{10}$), dibenzyl ($C_{14}H_{14}$), and the like is preferably used, as small-size cluster ion beams can be controlled easily.

The cluster size may be set as appropriate to 2 to 100, preferably to 60 or less, and more preferably to 50 or less. The cluster size may be adjusted by controlling the gas pressure of gas ejected from a nozzle, the pressure of the vacuum vessel, the voltage applied to the filament in ionization, and the like. The cluster size can be determined by finding the cluster number distribution by mass spectrometry based on a quadrupole high frequency electric field or by time-of-flight mass spectrometry and calculating the average value of the cluster numbers.

To further increase the peak concentration of hydrogen in the surface portion of the semiconductor wafer 10 even after the formation of the epitaxial layer 20, the beam current value of the cluster ions 16 is preferably 50 µA or more. When the cluster ions 16 containing hydrogen are applied under this current value condition, hydrogen included in the constituent elements of the cluster ions 16 more reliably forms a solid solution in the surface portion of the semiconductor wafer 10 over equilibrium concentration. To further ensure this effect, the beam current value is more preferably 100 µA or more, and further preferably 300 µA or more. The beam current value of the cluster ions 16 can be adjusted, for example, by changing the source gas decomposition conditions in the ion source.

If the beam current value is excessively high, there is a possibility that excessive epitaxial defects appear in the epitaxial layer 20. Therefore, the beam current value is preferably 5000 µA or less.

The acceleration voltage of the cluster ions, together with the cluster size, influences the peak position of the concentration profile in the depth direction of the constituent elements of the cluster ions. In this disclosure, the acceleration voltage of the cluster ions may be more than 0 keV/Cluster and less than 200 keV/Cluster, preferably 100 keV/Cluster or less, and further preferably 80 keV/Cluster or less. To adjust the acceleration voltage, two methods: (1) electrostatic acceleration and (2) radio-frequency acceleration are typically used. An example of the former method is a method of arranging a plurality of electrodes at regular intervals and applying the same voltage therebetween, to form a constant acceleration electric field in the axial direction. An example of the latter method is a linear acceleration (linac) method of accelerating ions using radio frequency while linearly moving them.

The dose of the cluster ions can be adjusted by controlling the ion irradiation time. In this disclosure, the dose of hydrogen may be $1 \times 10^{13}$ to $1 \times 10^{16}$ atoms/cm$^2$, and preferably $5 \times 10^{13}$ atoms/cm$^2$ or more. If the dose of hydrogen is less than $1 \times 10^{13}$ atoms/cm$^2$, there is a possibility that hydrogen diffuses during epitaxial layer formation. If the dose of hydrogen is more than $1 \times 10^{16}$ atoms; cm$^2$, there is a possibility that the surface of the epitaxial layer 20 is significantly damaged.

In the case of applying the cluster ions containing carbon as a constituent element, the dose of carbon is preferably $1 \times 10^{13}$ to $1 \times 10^{16}$ atoms/cm$^2$, and more preferably $5 \times 10^{13}$ atoms/cm$^2$ or more. If the dose of carbon is less than $1 \times 10^{13}$ atoms/cm$^2$, the gettering capability is not sufficient. If the dose of carbon is more than $1 \times 10^{16}$ atoms/cm$^2$, there is a possibility that the surface of the epitaxial layer 20 is significantly damaged.

A preferred embodiment of a semiconductor epitaxial wafer produced by the production method according to this disclosure is described below.

It is preferable that the peak of the hydrogen concentration profile is present in a range of a depth of 150 nm from the surface 10A of the semiconductor wafer 10 in the depth direction. This range may be defined as the surface portion of the semiconductor wafer in this description. Preferably, the peak of the hydrogen concentration profile is present in a range of a depth of 100 nm from the surface 10A of the semiconductor wafer 10 in the depth direction. Since it is physically impossible to have the peak position of the hydrogen concentration profile at the outermost surface (a depth of 0 nm from the surface 10A of the semiconductor wafer 10) of the semiconductor wafer irradiated with the cluster ions 16, the peak is present at a depth position of 5 nm or more.

The peak concentration of the hydrogen concentration profile is preferably $1.0 \times 10^{17}$ atoms/cm$^3$ or more, and more preferably $1.0 \times 10^{18}$ atoms/cm$^3$ or more.

The half width (FWHM: full width at half maximum) of the peak of the carbon concentration profile in the depth direction of the semiconductor wafer 10 in the modifying layer 18 is preferably 100 nm or less. Such a modifying layer 18 is a region in which carbon is localized as a solid solution at crystal interstitial sites or substitution sites in the surface portion of the semiconductor wafer, and can function as a strong gettering site. In terms of achieving high gettering capability, the half width is more preferably 85 nm or less. The lower limit may be set to 10 nm. The "carbon concentration profile in the depth direction" in this description denotes the concentration distribution in the depth direction measured by SIMS.

In terms of achieving higher gettering capability, it is preferable that, in addition to the above-mentioned hydrogen and carbon, one or more elements other than the main material of the semiconductor wafer (silicon in the case of a silicon wafer) form a solid solution in the modifying layer 18.

Moreover, to achieve higher gettering capability, the semiconductor epitaxial wafer 100 preferably has the peak of the carbon concentration profile in a range of a depth of 150 nm from the surface 10A of the semiconductor wafer 10 in the depth direction. The peak concentration of the carbon concentration profile is preferably $1 \times 10^{15}$ atoms/cm$^3$ or more, more preferably in a range of $1 \times 10^{17}$ to $1 \times 10^{22}$ atoms/cm$^3$, and further preferably in a range of $1 \times 10^{19}$ to $1 \times 10^{21}$ atoms/cm$^3$.

The thickness of the modifying layer 18 is defined as a region in which the concentration profile of the constituent element of the cluster ions 16 in the above-mentioned concentration profile is locally detected, and may be, for example, in a range of 30 nm to 400 nm.

(Method of Producing Solid-State Imaging Device)

A method of producing a solid-state imaging device according to one of the disclosed embodiments comprises forming a solid-state imaging device on a semiconductor epitaxial wafer produced according to the above-mentioned method of producing a semiconductor epitaxial wafer, i.e. on the epitaxial layer 20 located at the surface of the semiconductor epitaxial wafer 100. In the solid-state imaging device obtained by this production method, white spot defects are adequately suppressed as compared with solid-state imaging devices obtained by conventional methods.

EXAMPLES

More detailed description is given below using Examples, although the present disclosure is not limited to these Examples.

Reference Experimental Examples

First, the following Reference Experimental Examples were carried out in order to determine the difference of the silicon wafer surface portion depending on whether or not microwave heating is performed after cluster ion irradiation.

Reference Example 1

A p– type silicon wafer (diameter: 300 mm, thickness: 775 μm, dopant type: boron, resistivity: 20 Ω·cm) obtained from a CZ single crystal was prepared. A surface of the silicon wafer was then irradiated with cluster ions of $C_3H_5$ obtained by cluster-ionizing cyclohexane ($C_6H_{12}$) under the irradiation conditions of an acceleration voltage of 80 keV/Cluster (acceleration voltage per one hydrogen atom: 1.95 keV/atom, acceleration voltage per one carbon atom: 23.4 keV/atom, range distance of hydrogen: 40 nm, range distance of carbon: 80 nm), using a cluster ion generator (CLARIS made by Nissin Ion Equipment Co., Ltd.). A silicon wafer according to Reference Example 1 was thus obtained. The dose when applying the cluster ions was $6.67 \times 10^{14}$ cluster/$cm^2$. This is $3.3 \times 10^{15}$ atoms/$cm^2$ in terms of the number of hydrogen atoms, and $2.0 \times 10^{15}$ atoms/$cm^2$ in terms of the number of carbon atoms. The beam current value of the cluster ions was set to 800 μA.

Reference Example 2

A silicon wafer was irradiated with cluster ions under the same conditions as Reference Example 1. Following this, the silicon wafer was subjected to microwave heating using a microwave heater (DSG) made by Hitachi Kokusai Electric Inc., to obtain a silicon wafer according to Reference Example 2. The electromagnetic wave irradiation conditions when performing microwave heating were as follows:
microwave power: 10 W
estimated wafer temperature: 750° C.
treatment time: 300 sec
frequency: 2.45 GHz.

Reference Evaluation 1: Observation with TEM Sectional Photograph

For each of the silicon wafers according to Reference Examples 1 and 2, a section around the modifying layer after cluster ion irradiation was observed using a transmission electron microscope (TEM). FIG. 2A illustrates a TEM sectional view of Reference Example 1, and FIG. 2B illustrates a TEM sectional view of Reference Example 2. In each TEM sectional photograph, parts with black contrast are regions with particularly significant damage, and parts looking white are amorphized regions. In FIGS. 2A and 2B, a concentration profile by SIMS mentioned below is overlaid on the TEM sectional view. In FIG. 2B, parts that were amorphous regions in FIG. 2A have changed to black. It seems some kind of alteration such as phase transformation occurred, while recovering crystallinity.

Reference Evaluation 2: Evaluation of Concentration Profile of Silicon Wafer by Quadrupole-Type SIMS For each of the silicon wafers according to Reference Examples 1 and 2, the concentration profile of each of carbon, hydrogen, and oxygen in the depth direction was measured by quadrupole-type SIMS (resolution in depth direction: 2 nm, lower detection limit of hydrogen: $4.0 \times 10^{17}$ atoms/$cm^3$). FIG. 2A illustrates the concentration profile of Reference Example 1, and FIG. 2B illustrates the concentration profile of Reference Example 2. As can be seen from FIGS. 2A and 2B, the peak concentration of hydrogen decreased as a result of the microwave heating, but hydrogen remained in the outermost surface and the carbon implantation range of the silicon wafer even after the microwave heating.

Reference Evaluation 3: Measurement of Haze Level

For each of the silicon wafers according to Reference Examples 1 and 2, the silicon wafer surface was observed in DWN mode using Surfscan SP-1 (made by KLA-Tencor Corporation and the average value of the obtained haze values was evaluated as a haze level. In Reference Example 1, the haze level was 0.42 ppm. In Reference Example 2, the haze level was 0.03 ppm. The haze level in Reference Example 2 was found to recover to approximately the same level as immediately before cluster ion irradiation.

Experimental Example 1

Example 1

A silicon wafer was irradiated with cluster ions of $C_3H_5$ under the same conditions as Reference Example 2, and then subjected to microwave heating. After this, the silicon wafer was conveyed into a single wafer processing epitaxial growth apparatus (made by Applied Materials, Inc.), and subjected to hydrogen baking at a temperature of 1120° C. for 30 sec in the apparatus. A silicon epitaxial layer (thickness: 5 dopant type: boron, resistivity: 10 Ω·cm) was then epitaxially grown on the surface of the silicon wafer on the side where the modifying layer had been formed, by CVD at 1150° C. using hydrogen as carrier gas and trichlorosilane as source gas. An epitaxial silicon wafer according to Example 1 was thus produced.

Comparative Example 1

An epitaxial silicon wafer according to Comparative Example 1 was produced under the same conditions as Example 1, except that microwave heating was not performed.

<Evaluation 1: Evaluation of Concentration Profile of Epitaxial Wafer by Magnetic Sector-Type SIMS>

Figures 3A, 3B:
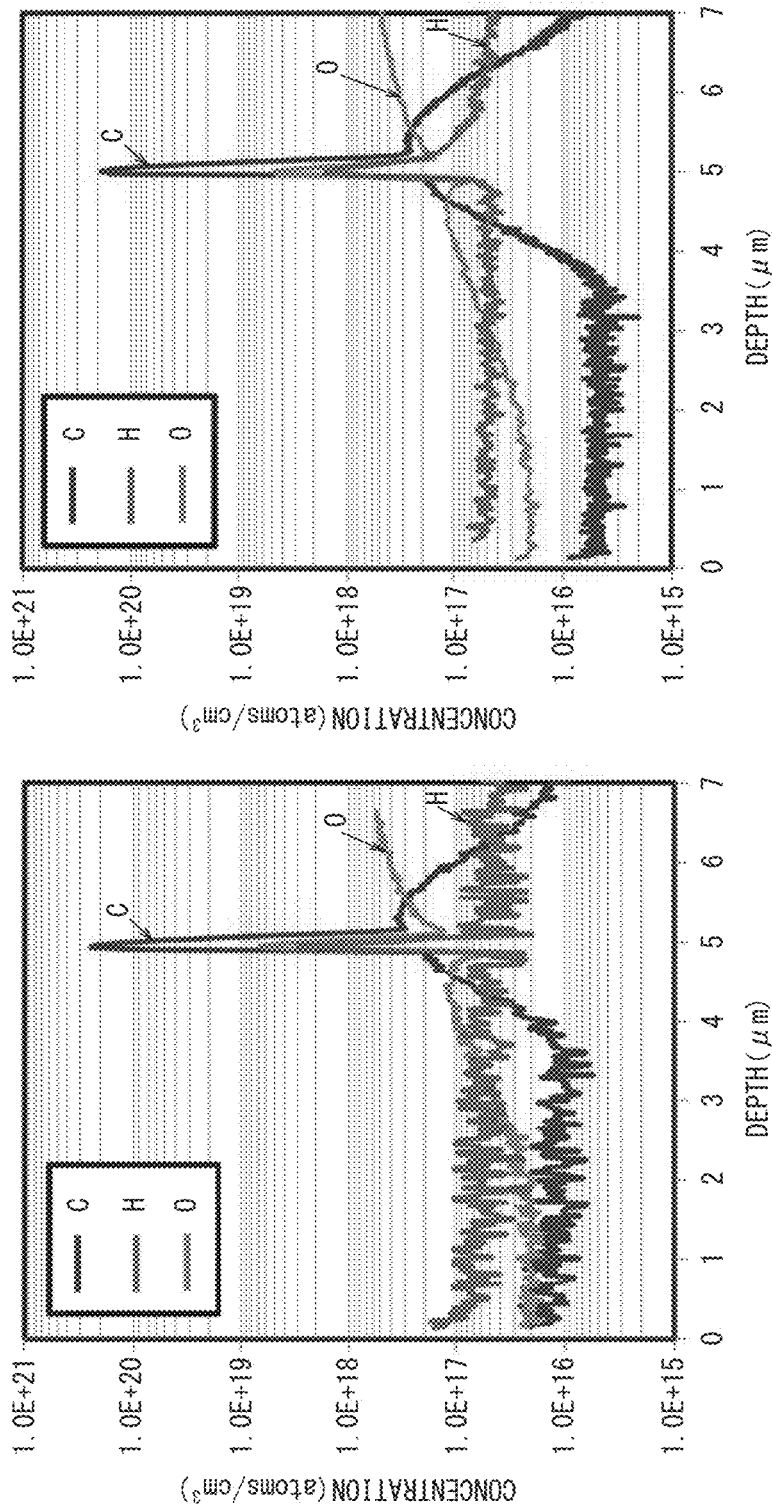
FIG. 3A is a graph illustrating the concentration profile of an epitaxial silicon wafer according to Example 1.
FIG. 3B is a graph illustrating the concentration profile of an epitaxial silicon wafer according to Comparative Example 1.

For each of the epitaxial silicon wafers according to Example 1 and Comparative Example 1, the concentration profile of each of hydrogen, carbon, and oxygen in the wafer depth direction was measured by magnetic sector-type SIMS measurement (resolution in depth direction: 30 nm, lower detection limit of hydrogen: $4.0 \times 10^{16}$ atoms/cm). FIG. 3A illustrates the concentration profile of Example 1, and FIG.

3B illustrates the concentration profile of Comparative Example 1. In FIGS. 3A and 3B, the depth in the horizontal axis is indicated with the epitaxial layer surface of the epitaxial silicon wafer being set as 0, A depth of up to 5 μm corresponds to the epitaxial layer, and a depth of 5 μm or more corresponds to the silicon wafer. When measuring the epitaxial wafer by SIMS, the thickness of the epitaxial layer inevitably has a measurement error of about ±0.1 μm. Accordingly, 5 μm is not a precise boundary value between the epitaxial layer and the silicon wafer in the drawing.

Figure 4:
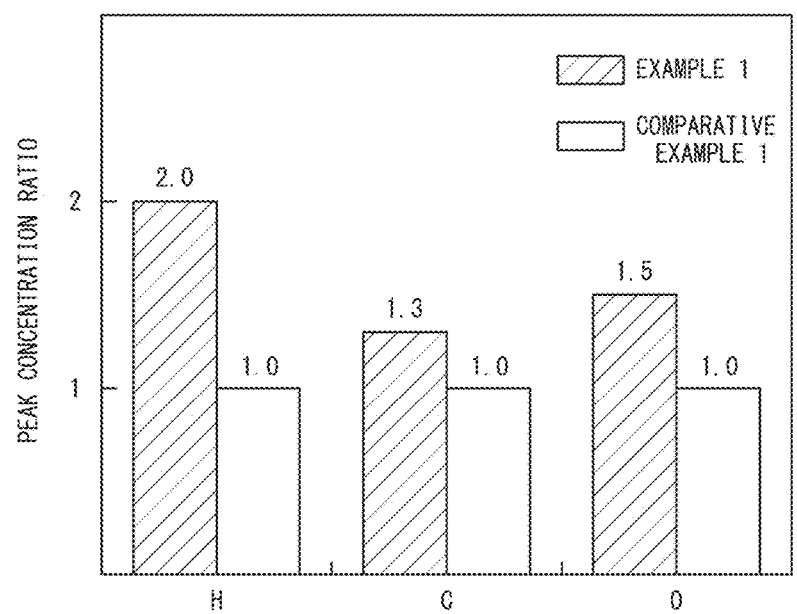
FIG. 4 is a graph for comparing the peak concentration ratios of the epitaxial silicon wafer according to Example 1 and the epitaxial silicon wafer according to Comparative Example 1.

As can be seen from FIGS. 3A and 3B, the peak concentration of each of the elements of hydrogen, carbon, and oxygen in the silicon wafer surface portion was higher in Example 1 than in Comparative Example 1. FIG. 4 is a graph illustrating the ratio of the peak concentration of each of the elements of hydrogen, carbon, and oxygen in Example 1, to the peak concentration of the corresponding element in Comparative Example 1 being set to 1. The peak concentration of hydrogen was particularly higher in Example 1 than in Comparative Example 1.

The peak concentrations of both of carbon and hydrogen which are constituent elements of the cluster ions increased. Given that the rate of increase of hydrogen which tends to diffuse outward is higher than that of carbon, it is more likely that hydrogen and a constituent element of the cluster ions other than hydrogen interacted with each other to induce some kind of alteration such as phase transformation in the cluster ion irradiation region, rather than that the diffusion of hydrogen was simply suppressed. This appears to result in an increase in the peak concentration of hydrogen in particular.

Moreover, as can be seen from FIGS. 3A, 3B, and 4, the carbon concentration and the oxygen concentration were higher in Example 1 than in Comparative Example 1. This indicates improved gettering capability in Example 1 as compared with Comparative Example 1.

Further, from Reference Evaluation 3 for Reference Experimental Example 1, the haze level after epitaxial layer formation was lower (improved) in Example 1 than in Comparative Example 1.

INDUSTRIAL APPLICABILITY

According to the present disclosure, a semiconductor epitaxial wafer production method that can increase the peak concentration of hydrogen in a surface portion of a semiconductor wafer after epitaxial layer formation can be provided. A semiconductor device produced using such a semiconductor epitaxial wafer has improved device properties.

REFERENCE SIGNS LIST 10 semiconductor wafer
10A surface of semiconductor wafer
16 cluster ions
18 (18') modifying layer
20 epitaxial layer
100 semiconductor epitaxial wafer
W electromagnetic waves

The invention claimed is:

1. A method of producing a semiconductor epitaxial wafer, the method comprising:
   a first irradiating provided by irradiating a surface of a semiconductor wafer with cluster ions containing hydrogen as a constituent element, to form a modifying layer formed from, as a solid solution, a constituent element of the cluster ions including hydrogen in a surface portion of the semiconductor wafer;
   a second irradiating, after the first irradiating, provided by irradiating the semiconductor wafer with electromagnetic waves of a frequency of 300 MHz or more and 3 THz or less, to heat the semiconductor wafer; and
   after the second irradiating, forming an epitaxial layer on the modifying layer of the semiconductor wafer.

2. The method of producing a semiconductor epitaxial wafer according to claim 1,
   wherein the cluster ions further contain carbon as a constituent element.

3. The method of producing a semiconductor epitaxial wafer according to claim 1,
   wherein in the first irradiating, a beam current value of the cluster ions is 50 μA or more.

4. The method of producing a semiconductor epitaxial wafer according to claim 1,
   wherein in the first irradiating, a beam current value of the cluster ions is 5000 μA or less.

5. The method of producing a semiconductor epitaxial wafer according to claim 1,
   wherein the semiconductor wafer is a silicon wafer.

6. A method of producing a solid-state imaging device, the method comprising
   forming a solid-state imaging device on an epitaxial layer of a semiconductor epitaxial wafer produced by the method of producing a semiconductor epitaxial wafer according to claim 1.

* * * * *